US008710924B2

(12) United States Patent
van der Zanden et al.

(10) Patent No.: US 8,710,924 B2
(45) Date of Patent: Apr. 29, 2014

(54) DOHERTY AMPLIFIER CIRCUIT

(75) Inventors: Josephus Henricus Bartholomeus van der Zanden, Best (NL); Igor Blednov, Nijmegen (NL); Iouri Volokhine, Stevensbeek (NL)

(73) Assignee: NXP, B.V., Eindhoven (NL)

( * ) Notice: Subject to any disclaimer, the term of this patent is extended or adjusted under 35 U.S.C. 154(b) by 16 days.

(21) Appl. No.: 13/463,747

(22) Filed: May 3, 2012

(65) Prior Publication Data

US 2013/0120061 A1    May 16, 2013

(30) Foreign Application Priority Data

May 6, 2011 (EP) .................................. 11250509

(51) Int. Cl.
*H03F 3/68* (2006.01)
(52) U.S. Cl.
USPC ...................................... 330/124 R; 330/295
(58) Field of Classification Search
USPC ............................ 330/53, 84, 124 R, 286, 295
See application file for complete search history.

(56) References Cited

U.S. PATENT DOCUMENTS

| 6,639,463 B1 * | 10/2003 | Ghanadan et al. ........ 330/124 R |
| 7,078,976 B2 | 7/2006 | Blednov |
| 7,427,895 B1 | 9/2008 | Okubo et al. |
| 2006/0044060 A1 | 3/2006 | Shiikuma |
| 2008/0111622 A1 * | 5/2008 | Sperlich et al. ........... 330/124 R |
| 2008/0238544 A1 * | 10/2008 | Morris et al. ................. 330/149 |
| 2009/0167434 A1 | 7/2009 | Elmala |
| 2009/0206928 A1 | 8/2009 | Bowles et al. |
| 2010/0026387 A1 | 2/2010 | Blednov |
| 2010/0227599 A1 | 9/2010 | Vella-Coleiro et al. |

FOREIGN PATENT DOCUMENTS

| JP | 2002 124840 A | 4/2002 |
| WO | 2008/053534 A1 | 5/2008 |

OTHER PUBLICATIONS

Kyoung-Joon, Cho, et al.; "N-Way Distributed Doherty Amplifier with an Extended Efficiency Range"; Microwave Symposium, 2007; IEEE/MTT-S Intl, IEEE, PI; pp. 1581-1584 (Jun. 2007).
Kim, Bumman, et al.; "Optimized Envelope Tracking Operation of Doherty Power Amplifier"; Signals, Circuits and Systems, 2009, 3$^{rd}$ Intl. Conference on; IEEE, Piscataway, NJ, US; pp. 1-5 (Nov. 2009).
European Search Report for Patent Appln. No. 11250509.4 (Mar. 19, 2012).

* cited by examiner

*Primary Examiner* — Khanh V Nguyen

(57) ABSTRACT

The present invention relates to an amplifier comprising a plurality of Doherty amplifier cells each Doherty amplifier cell comprising an input and an output respectively connected to an input and an output of the amplifier, a main amplifier stage, a peak amplifier stage and a signal combining circuit configured to combine signals from outputs of the main and peak amplifiers and provide a combined signal to the output of the Doherty amplifier cell. Each cell comprises a controllable splitter having an input (connected to the input of the Doherty amplifier cell. The controllable splitter is configured to receive a splitter control signal and modify an amplitude and phase of a signal at the input of the Doherty amplifier cell in response to the splitter control signal.

9 Claims, 8 Drawing Sheets

DOHERTY AMPLIFIER CIRCUIT

CROSS-REFERENCE TO RELATED APPLICATIONS

This application claims the priority under 35 U.S.C. §119 of European patent application no. 11250509.4, filed on May 6, 2011, the contents of which are incorporated by reference herein.

BACKGROUND

The present disclosure relates to the field of Doherty amplifiers.

DETAILED DESCRIPTION

Figure 1A:
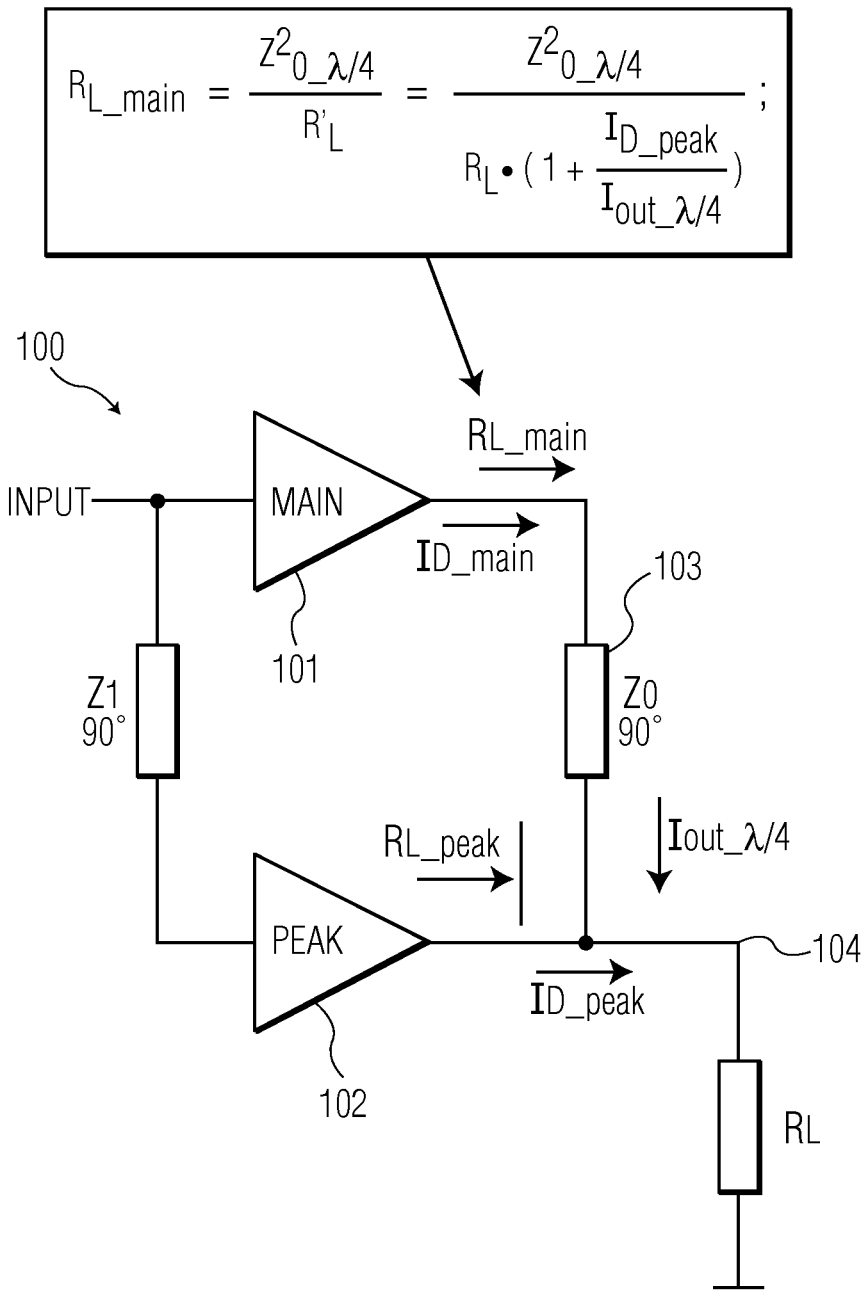
FIG. 1a is a schematic circuit diagram of a Doherty amplifier.

Many modern communication systems use digital modulation techniques. Digital modulation generates a variable envelope of RF output power that can cause distortion when amplified, since the average output power of such signals can be 6 to 12 dB below the peak power. To keep the power efficiency of an RF amplifier at a high level, the amplifier may be configured to stay close to compression during power peaks caused by the digital modulation. The distortion generated by the amplifier during these peaks can be compensated for by applying a modified input signal for correcting this non ideal amplifier operation. To further lower power consumption, complex amplifier techniques may be used. One such technique involves the use of so-called Doherty amplifiers, which offer improved power efficiency performance with reasonably low distortions. There are several known variants of Doherty amplifiers, such as symmetrical, asymmetrical and N-way Doherty amplifiers.

A symmetrical Doherty amplifier, which is built of two equal size or power capable devices, or amplifiers, enhances the efficiency in a power range from peak power level indicated as 0 dB down to −6 dB, the so-called "back-off" level. An asymmetrical Doherty amplifier architecture consists of two devices or amplifiers, having different power capability, in which a peak device is of larger power capability than a main device, being usually up to twice that of the main device size. A basic version of such a Doherty amplifier consists of two in parallel combined amplifiers. The main amplifier operates in class AB mode while the peak amplifier operates in class C mode. An input signal is split in two portions before being fed to the main and peak amplifiers. A phase shifter delays the signal fed to the peak amplifier by 90 degrees compared to the phase of the signal at the input of main device. The two output signals from the main and peak amplifiers are combined at the output of the Doherty amplifier by an impedance inverter, or so called "Doherty combiner". An impedance inverter is placed between the outputs of the main amplifier and peak amplifier, the impedance inverter having a characteristic impedance equal to the optimum load for the main amplifier, in order to maximize the output power delivered by the main amplifier to the output of the Doherty amplifier. The input phase shifter ensures that the combined signal at the output of the Doherty amplifier is again in phase.

There are several issues related to traditional high power Doherty amplifiers, including: i) a narrow operational bandwidth, which is limited by impedance transformation networks connected to input and output of main and peak power devices; and ii) poor linearity, which can be caused by mismatch of the phase and amplitude of signals at inputs and outputs of main and peak amplifier stages within an operational frequency band.

A traditional Doherty amplifier typically comprises two separately packaged high power transistors with impedance transformation structures at the input and output, an input splitter and output inverter/combiner, all of which are arranged on a printed circuit board. Power division and phase characteristics of the input inverter are power- and frequency-dependent due to presence of impedance transformers and also the power dependency of the input impedance of the peak amplifier stage operating in C-class. As for example shown in U.S. Pat. No. 7,078,976, if impedance transformers are excluded from the outputs of the main and peak devices, the operational bandwidth of a Doherty output inverter, or combiner, and also that of the Doherty amplifier, can be close to a theoretical limit. A bandwidth greater than 30% can be achieved by such a device, while the measured bandwidth of a typical state of the art 250 W Doherty amplifier is typically less than 7%.

An objective of the present invention is to provide a scalable amplifier concept that can ideally fit in a single package, providing improved power efficiency and linearity over a wide frequency band.

The listing or discussion of a prior-published document or any background in the specification should not necessarily be taken as an acknowledgement that the document or background is part of the state of the art or is common general knowledge.

According to a first aspect of the present invention there is provided an amplifier comprising a plurality of Doherty amplifier cells, each Doherty amplifier cell comprising:

an input and an output respectively connected to an input and an output of the amplifier;

a main amplifier stage;

a peak amplifier stage;

a signal combining circuit configured to combine signals from outputs of the main and peak amplifiers and provide a combined signal to the output of the Doherty amplifier cell; and a controllable input power splitter having an input connected to the input of the Doherty amplifier cell, the controllable splitter configured to modify an amplitude and phase of a signal at the input of the Doherty amplifier cell in response to a received splitter control signal and to provide a first modified signal to the input of the main amplifier stage and a second modified signal to the input of the peak amplifier stage.

Providing each Doherty amplifier cell of the amplifier with its own controllable splitter allows the amplifier to be operated with improved power efficiency because each input controllable splitter can be used to ensure that each cell in the amplifier has its signal modifying properties tailored to the efficiency and linearity requirements currently being faced.

Each Doherty amplifier cell may comprise a plurality of main and peak amplifiers and signal combining circuits, in which the controllable input power splitter is configured to provide the first modified signal to the input of each main amplifier and the second modified signal to the input of each peak amplifier, the output of the Doherty amplifier cell being a combination of the combined signals from each of the signal combining circuits. An advantage of having a plurality of main and peak amplifiers, with a common controllable input power splitter, is that the power output of the amplifier can be more efficiently scaled while reducing the need for additional space for an input power splitter for each pair of main and peak amplifiers.

The present invention can be applied to symmetric, asymmetric or n-way Doherty amplifiers, for example.

The controllable splitter may be provided on the same die as the Doherty amplifier in each cell, or may be provided on a separate chip or circuit board and connected to the Doherty amplifier cells by wire bonding or flip chipping, for example. The controllable splitter may further comprise a quadrature modulator.

The signal combining circuit may impose a 90 degree phase shift on to the output signal from the main amplifier stage. Typically, the signal provided to the main amplifier stage is 90 degrees out of phase with the signal provided to the input of the peak amplifier stage, as with conventional Doherty amplifiers.

The main amplifier stage may be configured as a class AB amplifier stage. The peak amplifier stage may be configured as a class C amplifier stage. The signal combining circuit may comprise inductive, capacitive and resistive elements. Alternatively, the signal combining circuit may comprise a transmission line.

The controllable splitter may comprise a main channel controller with an input coupled to the input of the Doherty amplifier cell and an output coupled to the input of the main amplifier stage. The controllable splitter may comprise a peak channel controller with an input coupled to the input of the Doherty amplifier cell and an output coupled to the input of the peak amplifier.

The splitter control signal may comprise first and second splitter control signals. The main channel controller may be configured to receive a first splitter control signal, modify an amplitude and phase of a signal at the input of the Doherty amplifier cell in response to the first splitter control signal and provide the first modified signal to the input of the main amplifier stage. The peak channel controller may be configured to receive the second splitter control signal, modify an amplitude and phase of a signal at the input of the Doherty amplifier cell in response to the second splitter control signal and provide the second modified signal to the input of the peak amplifier stage.

Alternatively, the peak channel controller or main channel controller may be configured to modify either only the phase or only the amplitude of the input signal as a function of power level and/or frequency when required. Another configuration may be that only one controller is used at the input of either the main or the peak amplifier.

The controllable splitter may comprise a 90 degree fixed phase shifting element coupled between the input of the Doherty amplifier cell and the input of the peak amplifier stage. Alternatively, the 90 degree fixed phase shifting element may be provided separately from the controllable splitter. The 90 degree fixed phase shifting element may be coupled between the input of the Doherty amplifier cell and the input of the peak channel controller, either before or after the controllable splitter. The fixed phase shifting element may comprise inductive, capacitive and resistive elements. Alternatively, the fixed phase shifting element may comprise a transmission line.

Each Doherty amplifier cell may comprise a control circuit for providing the splitter control signal. The control circuit may be configured to determine an amplitude of a signal at the input or output of the Doherty amplifier cell and to provide the splitter control signal to the controllable splitter as a function of the determined signal amplitude, temperature and/or frequency The control circuit may be provided on the same die as the Doherty amplifier in each Doherty amplifier cell. Alternatively, a plurality of cells may share a common control circuit either integrated in the same package or provided separately. The control circuit may be configured to determine an amplitude of both the input and output signal. The signal amplitude may be an instantaneous signal amplitude. Alternatively, the signal amplitude may be a mean amplitude, such as an RMS amplitude.

Each Doherty amplifier cell may further comprise a supply modulator configured to receive a supply control signal and to set a power supply voltage or current for the main amplifier stage in response to the supply control signal.

The supply modulator can improve the power efficiency of the amplifier below the power threshold level where the peak amplifier operates. The supply modulator can be used to limit or eliminate the power consumption of the main amplifier of a cell that faces reduced amplification requirements. The supply modulator may be integrated on a common die with the Doherty amplifier or can be provided on a separate die. Alternatively, a plurality of Doherty amplifiers may share a single supply modulator.

The control circuit may be configured to provide a supply control signal to the supply modulator in response to the determined signal amplitude at the input or output of the Doherty amplifier cell. The signal amplitude may be the input signal amplitude, the output signal amplitude or a combined input and output signal amplitude. The amplitude of the signal may correspond to the power, voltage or current of the signal.

The control circuit may be configured to provide a bias control signal to the main and peak amplifiers as a function of the determined signal amplitude. Control of the individual gate bias of the main and peak amplifier stages of the Doherty amplifier cell allows for the efficiency of the amplifier to be improved by modifying the gate bias depending upon the instantaneous power requirements of the amplifier. The bias levels of the peak amplifier in each cell can be varied to change the threshold level at which the peak amplifier starts to operate. The bias level of the main amplifier can be modified to ensure that the whole of the amplifiers voltage swing range is utilised.

The control circuit may comprise a memory. The memory may contain a look-up table, which may be programmed during manufacture of the amplifier. The control circuit may be configured to obtain a value from the look-up table corresponding to an input or output amplitude and to generate a control signal in accordance with the value. The control signal may be the bias control signal, splitter control signal or supply control signal. Alternatively, the control circuit may calculate the required control signal using the input or output amplitude in combination with a predefined formula. The control circuit may calculate the control signal in accordance with a requirement for the amplifier to have a linear response for a given input amplitude.

The controllable splitter may be configured to split the power from the signal at the input of the Doherty cell between the output of the controllable splitter coupled to the input of the main amplifier and the output of the controllable splitter coupled to the input of the peak amplifier. The controller may determine the ratio in which to split the input signal amplitude and phase shift by reference to the input amplitude of the Doherty amplifier.

The control circuit may be configured to obtain a value from the look-up table corresponding to a temperature and to generate a bias control signal in accordance with the value. This allows the control circuit to correct for a temperature dependence of the gate bias. The value looked up may comprise the control signal. The control circuit may be further configured to determine the temperature of the amplifier.

Each Doherty amplifier cell may comprise one or more further amplifier stages coupled to the input of the main amplifier stage, the peak amplifier stage or the input of the Doherty amplifier cell.

The present invention provides a scalable amplifier concept that can fit in a single package, providing improved power efficiency and linearity over a wide frequency band. Embodiments of the amplifier concept are intended particularly for mobile communications systems, which tend to have high peak-to average ratios of variable RF power envelope and strict linear amplification requirements.

The invention will now be further described by way of example only with reference to the accompanying drawings.

In a Doherty amplifier circuit, the peak amplifier operates in class C mode and has a lower gain than the main amplifier, typically differing by around 4-5 dB. The input signal has to therefore be split in two non-equal portions, a so called asymmetrical split, to compensate for the lower power gain of the peak amplifier stage. This ensures that both the main and peak amplifiers generate the same power at peak power levels.

The principle of operation of a Doherty peak amplifier 100, operates in example of which is illustrated in FIG. 1a, can be explained by describing the range between two different states of the amplifier.

In a first operational state the output signal power level is at its maximum. The signal at the output of the main and peak amplifier stages 101, 102 are at the same power level and differ 90 degrees in phase. A second, post amplification, 90 degree phase shift is applied to the signal from the main amplifier stage by an impedance inverter ensures that signals from the main and peak amplifier stages arrive in-phase at a combining point. The impedance inverter at peak power level of the Doherty amplifier is terminated by its characteristic impedance 103 Zo and therefore does not transform the impedance of the main amplifier and instead only changes the phase of the output signal. Both amplifiers 101, 102 see their ideal load for generating the maximum output signal power in this operational state.

In a second operational power state, where the power input is at the peak device power threshold level, i.e. below the back-off power range, the peak amplifier gain is ideally zero. The peak amplifier 102 delivers no power to the output 104 and is effectively in an "off state" because it is biased in such a way that it only starts to produce an output above the peak device threshold power level. Below this peak device threshold power level the input signal fed to the peak amplifier 102 is not strong enough to cause a response at the output of the amplifier 100. In this second operational power state the load impedance of peak device ideally is infinitely high, while for the main device 101 it is maximal and depending on asymmetry of Doherty architecture may be in the range of two to four times the output impedance Zopt for the main device. Since the peak amplifier 102 is not delivering power it will see an infinite, or "open" impedance.

In the sub-threshold power state the main amplifier stage will operate up to its maximum output voltage, allowing for operation with higher power efficiency. The main amplifier is the only amplifier operating and is working at a two times higher load line in case of a symmetrical structure, allowing for a lower current consumption, but delivering about 3 dB higher gain. Because the peak amplifier is turned off it has no contribution to the output power and power consumption is reduced Between the two states described above, from 6 dB back-off up to the peak power level, there is a trajectory where the load of the main amplifier is modulated by the peak amplifier in such a way that the main amplifier is not compressed too much but operates at its maximum voltage swing. The impedance seen by the main amplifier will gradually change from a double load line at the threshold level to its characteristic impedance at the peak power level.

The shape of this trajectory is dependent on the technology chosen to implement the Doherty amplifier with each technology having its typical drive characteristic of peak device from Off state to maximum power (Pmax) state and will not be ideal for every power level. There will be parts of the trajectory where the amplitude and phase differences between the main and peak amplifiers are not ideal. To have optimum control, independent of the technology of choice, in accordance with aspects of the present invention the input amplitude and phase splitting should be controlled such that the splitting ratio of the input signal between the main and peak amplifiers depends on the input power level. This may be achieved by analog and/or digital control circuitry that sets the splitting ratio of the input signal between the main and peak amplifiers depending on the input power level. This will lead to a reduced power consumption while retaining a low distortion level.

Figure 1B:
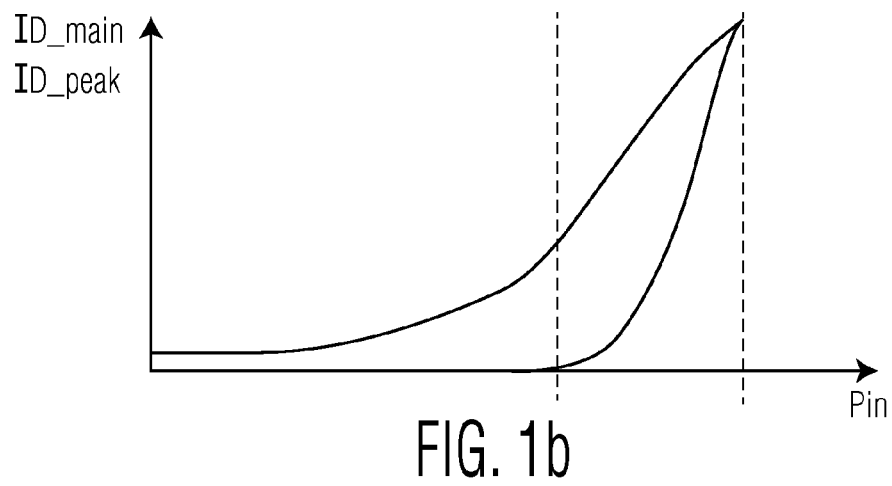
FIG. 1b is a schematic plot of drain current as a function of input power for a typical Doherty amplifier.
Figure 1C:
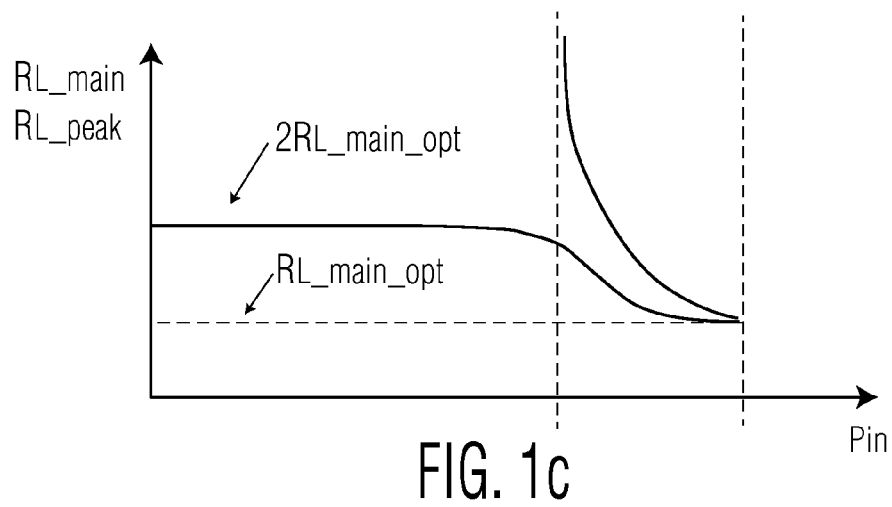
FIG. 1c is a schematic plot of load impedance as a function of input power for a typical Doherty amplifier.
Figure 1D:
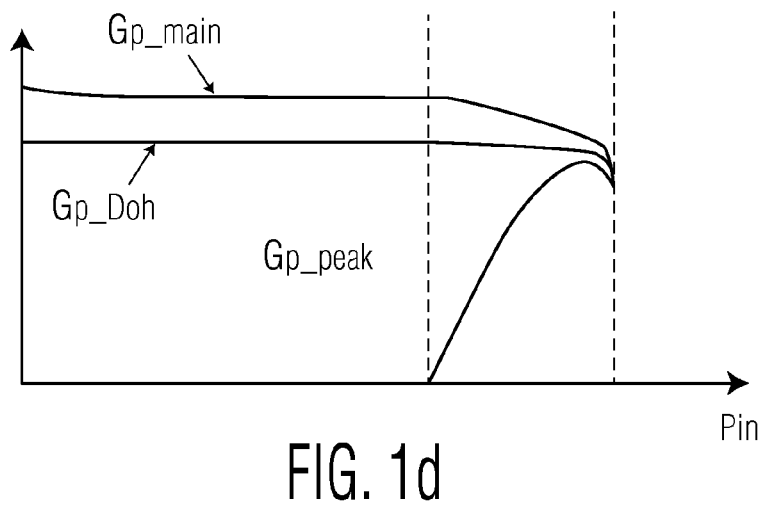
FIG. 1d is a schematic plot of gain as a function of input power for a typical Doherty amplifier.

FIGS. 1b, 1c and 1d illustrate various aspects of the operation of a Doherty amplifier of the kind discussed above.

Figure 2A:
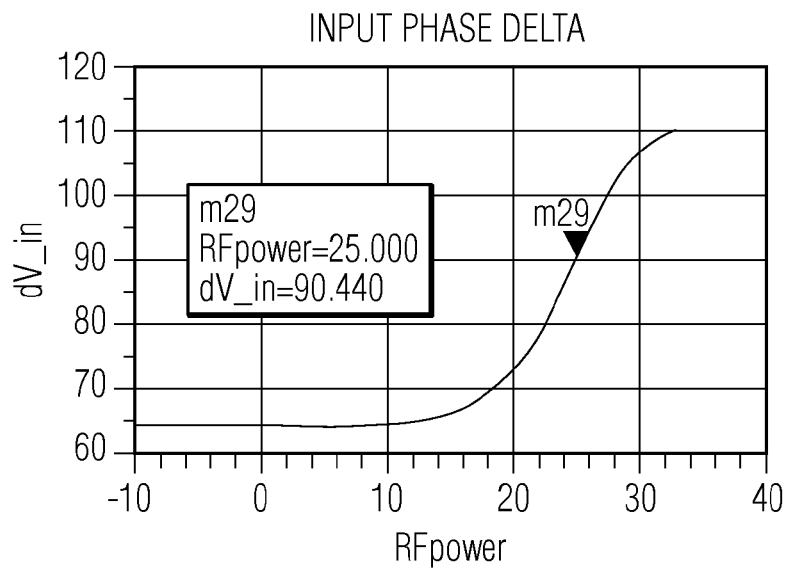
FIGS. 2a and 2b are simulated lots of phase offset mismatch as a function of output power level.
Figure 2B:
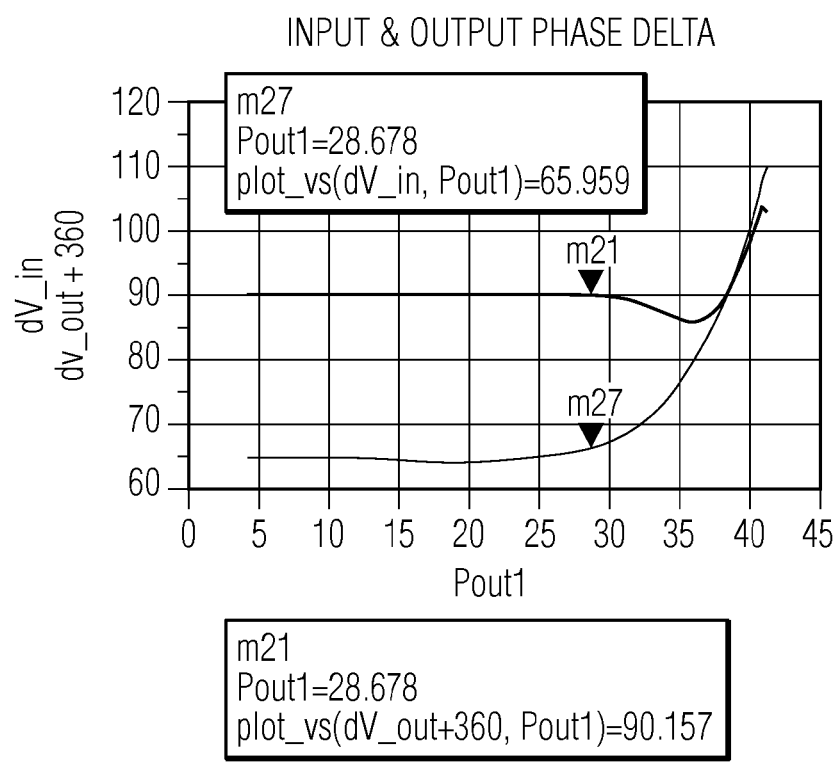

FIG. 2a is a plot of simulated phase offset between the inputs of main and peak LDMOS devices and the deviation of phase as a function of power level. FIG. 2b shows the simulated phase offset mismatch at a central frequency between the inputs and outputs of main and peak devices as a function of Doherty output power level. These plots illustrate the need for phase and amplitude control at the input of at least the peak device to avoid amplitude and phase mismatches, which tend to degrade operation of the Doherty amplifier in the back-off power range.

Figure 3:
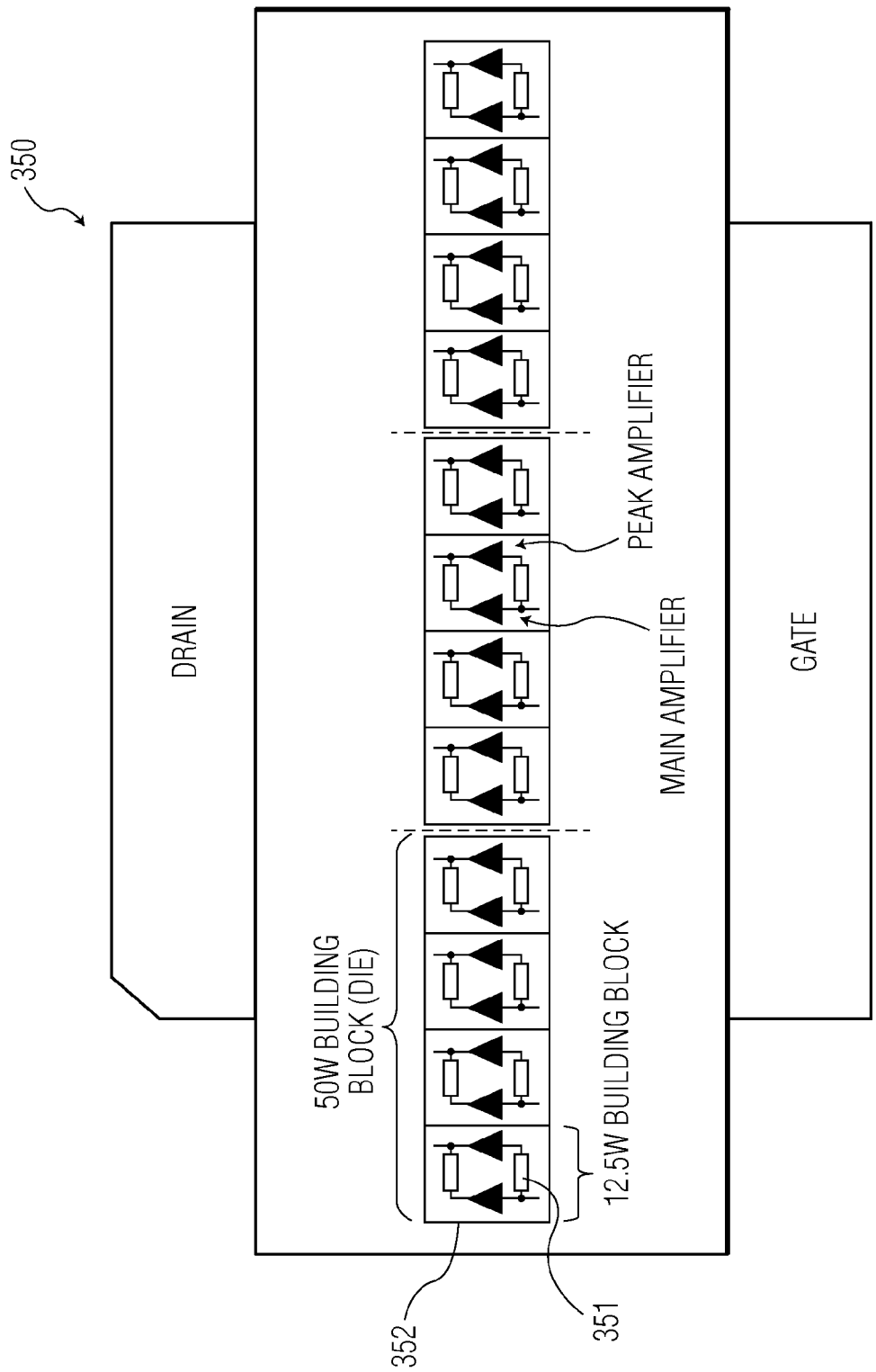
FIG. 3 is a schematic diagram of a high power integrated Doherty amplifier comprising multiple Doherty amplifier cells with passive input power splitters.

FIG. 3 is a schematic diagram of a high power integrated Doherty amplifier 350 following the disclosure of US 2010/0026387, in which passive input power splitters 351 are used in building blocks 352 comprising main and peak amplifiers. Multiple such building blocks are used in parallel in the amplifier 350.

When providing an integrated Doherty amplifier package consisting of multiple paralleled Doherty amplifiers such as the package illustrated in FIG. 3, it is not possible to have a separate main and a separate peak amplifier input and a single output for the whole package without sacrificing performance factors such as gain and power added efficiency due to losses in the combining lines. The scalability of such an integrated Doherty amplifier package is therefore limited.

The efficiency of a standard Doherty amplifier is also not enhanced when the signal power is below the threshold where the peak amplifier is operated.

In accordance with aspects of the invention, full use of a controllable input splitter allows for the benefits of operating parallel Doherty amplifier cells to be retained, and specifically the benefits relating to scalability of power handling. Power scaling allows an amplifier containing multiple Doherty amplifier cells to reduce overall power consumption by sharing the power load between cells.

Figure 4:
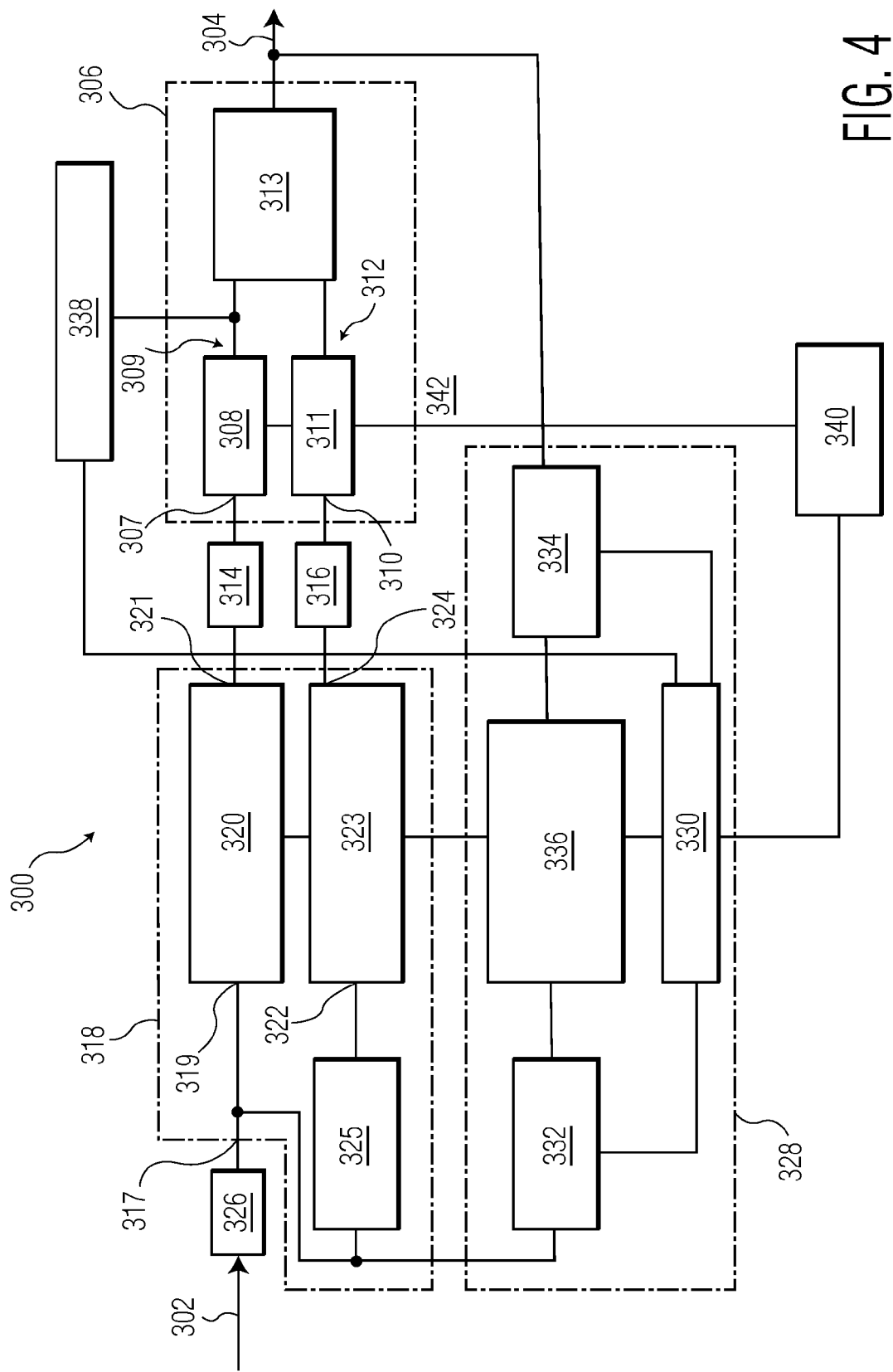
FIG. 4 is a schematic diagram of an exemplary Doherty amplifier cell.

A block diagram of an exemplary Doherty amplifier cell according to an embodiment of the invention is illustrated in FIG. 4. The cell 300 comprises a conventional Doherty amplifier die 306 which contains a main amplifier stage 308, a peak amplifier stage 311 and a signal combining circuit 313. Outputs 309, 312 of the main and peak amplifiers 308, 311 are connected to respective inputs of the signal combining circuit 313. An output signal from the main amplifier 308 leads an output signal from the peak amplifier 311 by 90 degrees. The signal combining circuit 313 brings the two signals into phase by applying a 90 degree phase shift to the signal from the main amplifier 308. For ease of implementation on an integrated circuit, the phase shift may be achieved using a capacitive or inductive region of the Doherty amplifier die. The signal combining circuit 313 produces a combined signal, which is provided to an output 304 of the Doherty amplifier cell 300.

The Doherty amplifier cell 300 comprises a controllable splitter 318 configured to control the amplitude and phase splitting depending on the value of a received splitter control signal. The controllable splitter 318 has an input 317 coupled to the input of the Doherty amplifier cell 302. In the embodiment shown this coupling is achieved via a first gain stage 326.

The controllable splitter 318 provides two output signals derived from the signal applied to its input 317. A first output 321 of the controllable splitter 318 is connected to the input 307 of the main amplifier stage 308, in this case via a second gain stage 314. A second output 324 of the controllable splitter is connected to the input 310 of the peak amplifier stage 311, in this case by a third gain stage.

The controllable splitter 318 is configured to provide a variable gain and phase shift independently for its two output signals. The controllable splitter 318 comprises a main channel controller 320 configured to receive a splitter control signal and modify an amplitude and phase of a signal at the input 302 of the Doherty amplifier cell 300 in response to the splitter control signal. This modified signal is provided at the output 321 of the controllable splitter 318 and to the input 307 of the main amplifier stage 308.

In the embodiment shown in FIG. 4 the controllable splitter also comprises a fixed phase shifting element 325, configured to apply a 90 degree phase shift to an input signal applied to the amplifier input 317.

The phase shifting element 325 is coupled between the input 317 and an input of a peak channel controller 323. The 90 degree fixed phase shifting element 325 provides a signal to the input 322 of a peak channel controller 323 part of the controllable splitter 318. The peak channel controller 323 is configured to receive a splitter control signal and modify an amplitude and phase of a signal at the input 302 of the Doherty amplifier cell 300 in response to the splitter control signal. This modified signal is provided at an output 324 of the controllable splitter 318 and to the input 310 of the peak amplifier stage 311.

Since the Doherty amplifier cell 300 has its own controllable splitter, the scalability achieved by combining such Doherty amplified cells in parallel can be is maintained. The controllable splitter 318 can be integrated on the Doherty die 306 but could alternatively be made on a separate die technology and combined by wire-bonding, flip chipping or any other connection technique for connecting a plurality of dies. The controllable splitter 318 will typically comprise several different blocks such as, for example, a fixed 90 degrees wideband phase shifter, adjustable attenuators/amplifiers, adjustable phase shifters, quadrature modulators and linear power amplifiers.

The Doherty amplifier cell 300 shown in FIG. 3 further comprises a control circuit 328, although this may not be an essential feature of all embodiments. The control circuit 328 shown has an input detector 332, coupled to the input 302 of the Doherty amplifier cell 300, and an output detector 334, coupled to the output 304 of the cell 300. The input and output detectors are used to determine the signal amplitude at the input or output. This may be the amplitude of the signal in terms of power, voltage or current.

The control circuit 328 shown in FIG. 4 comprises a controller 330, which is coupled to an input detector 332 and output detector 334. The input and output detectors 332, 334 are connected to the input 317 and output 304 of the Doherty amplifier cell 300 for detection of power levels.

The controller 330 may include the functions of the input or output detectors 332, 334. The controller 330 is configured to determine a suitable amplitude and phase for the controllable splitter 318 from the input or output power level determined by the input or output detector 332, 334 and provide a splitter control signal to the controllable splitter 318.

The controller 330 derives the splitter control signal by reference to a memory 336, which may for example be in the form of a look-up table. A value for the splitter control signal is obtained from the memory after providing the detected input or output power, and the splitter control signal then passed to the controllable splitter 318.

The lookup table for the power splitting can be programmed during production. The amplitude and phase modifications required for improved power splitting can for example be correlated to the output signal amplitude. The values saved in the look-up table can also be optimized so that the response of the amplifier is closer to being linear over a greater range of operation. The lookup table for linearization can be correlated to the input signal amplitude. The look-up table value for the power splitting and linearization can be a single set of values or separate values. This look-up table data can be calculated by modeling or acquired through empirical testing of a Doherty amplifier cell 300.

The embodiment in FIG. 4 also shows an optional supply modulator 338 coupled to the controller 330 and to the output 309 of the main amplifier stage 308. The supply modulator 338 is configured to vary the power supply of the main amplifier stage 308 in response to receiving a supply control signal from the controller 330. Alternatively, the supply modulator 338 may be implemented as part of the controller 330. The power supply required by the main amplifier can be calculated by the controller as it should be proportional to the input power level, which is determined by the input detector 332. Alternatively, the controller 330 can be configured to store a supply control signal corresponding to various input power levels in a look-up table in the memory 336. The supply control signal may be a digital signal or an analogue signal.

The supply modulator can be used to improve the efficiency of the amplifier 300 while it is operating below the power threshold where the peak amplifier 311 is switched on.

The supply modulator 338 may be integrated on the Doherty amplifier die 306 or may be provided on a separate die.

The controller 330 and memory 336 may also be used to control a bias setting of the main and peak amplifier stages, by means of a gate bias module 340. This optional control can be used to influence the cut-off level of the peak amplifier 311 and to compensate for temperature-related effects for both the main and peak amplifier stages 308, 311.

A separate look-up memory may be provided in the gate bias module 340 to store gate bias values, or combined with the memory 336.

The look-up table can correlate gate bias values to a measured temperature or to the input or output amplitude, as determined by the input and output detectors 332, 334. The gate bias module 340 is shown coupled to a gate bias terminal 342 of the Doherty amplifier die 306 for applying a gate bias to the peak and main amplifiers 311, 308.

Figure 5:
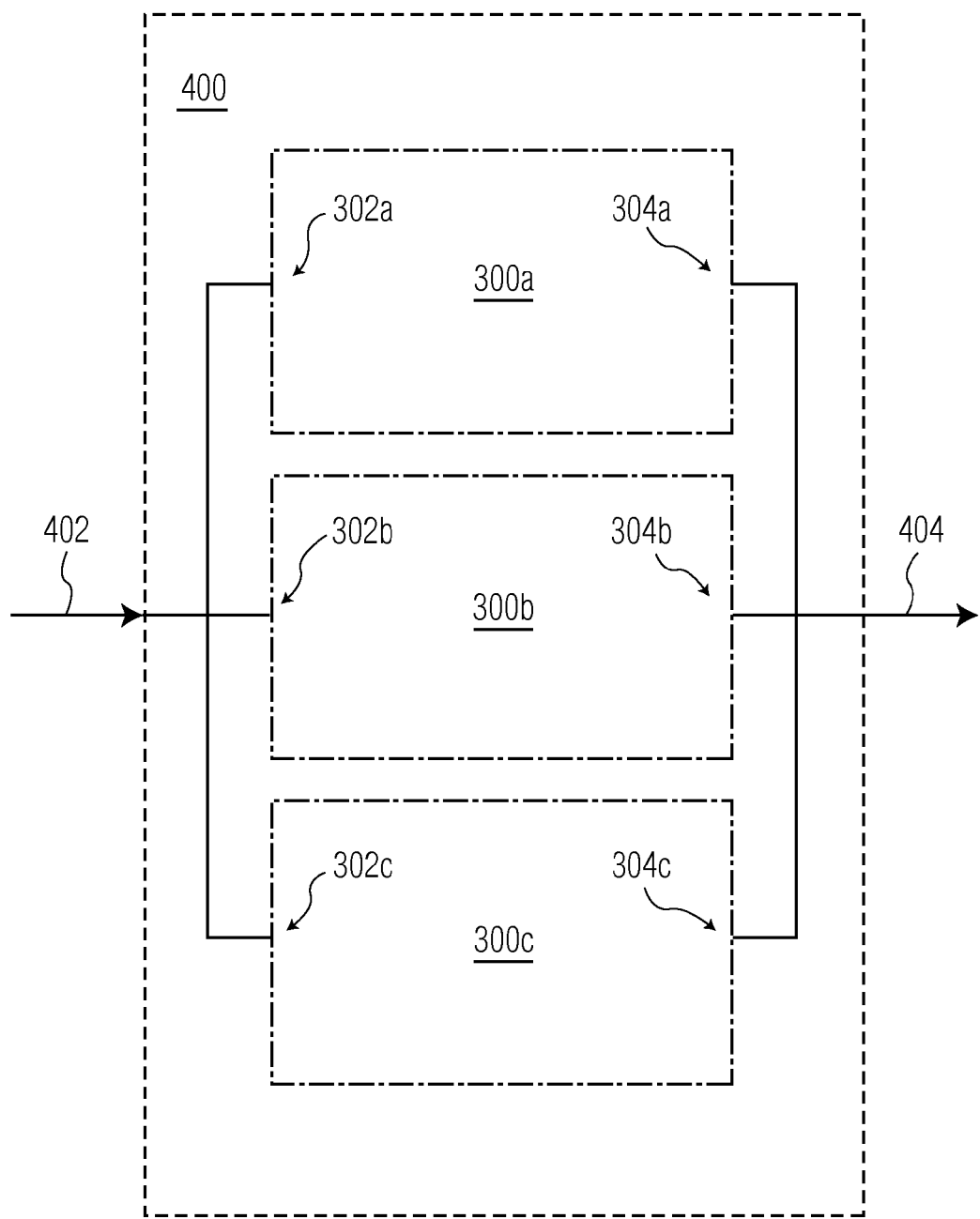
FIG. 5 is a schematic diagram of an amplifier comprising multiple Doherty amplifier cells connected in parallel.

FIG. 5 shows a schematic block diagram of an amplifier 400 in accordance with an embodiment of the invention. The amplifier 400 comprises three Doherty amplifier cells 300a, 300b, 300c arranged in parallel. Each cell may be in the form of the exemplary Doherty amplifier cell shown in FIG. 4. Functions of the control circuit 328 may be provided separately within each cell or may be shared between multiple cells 300a, 300b, 300c within the amplifier 400.

The amplifier 400 has a single input 402 which is coupled to each of the inputs 302a, 302b, 302c of the plurality of Doherty amplifier cells 300a, 300b, 300c within the amplifier. Three cells 300a, 300b, 300c are shown in the embodiment of FIG. 5. However, it is apparent that the amplifier may comprise any number of cells greater than one. The cells 300a, 300b, 300c are connected in parallel, i.e. have their inputs connected to a common input 402 and their outputs connected to a common output 404.

In the embodiment shown in FIG. 5, the task of amplifying a signal at the input 402 of the amplifier 400 is shared between the different cells 300a, 300b, 300c.

Figure 6:
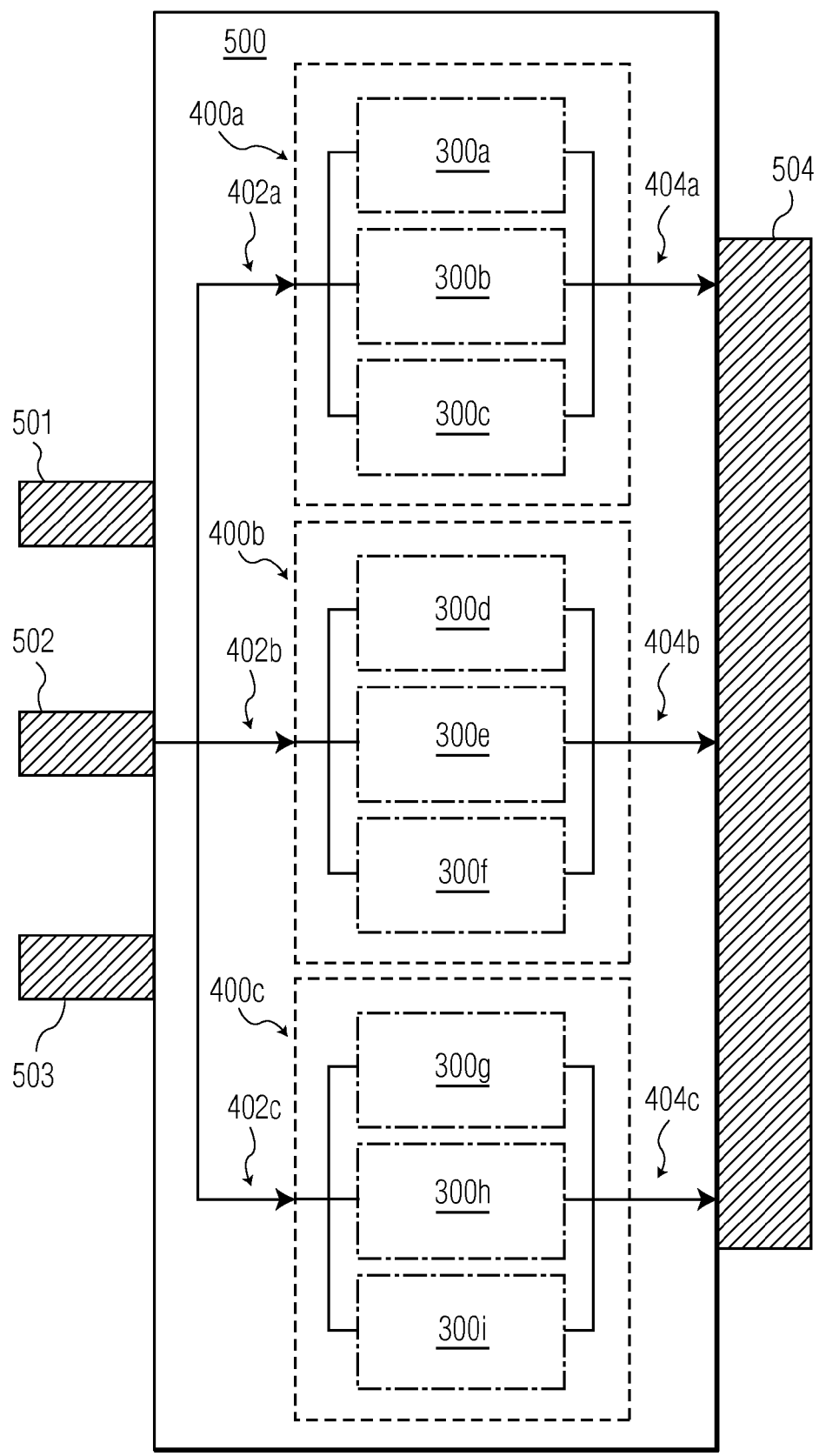
FIG. 6 is a schematic diagram of an exemplary amplifier comprising multiple parallel Doherty amplifier cells.

FIG. 6 shows a further embodiment in which three of the amplifiers 400 of FIG. 5 are themselves arranged in parallel within an integrated amplifier 500. Each amplifier 400a, 400b, 400c has an input 402 coupled to the input 502 of the integrated amplifier 500. The outputs 404a, 404b, 404c of the individual amplifiers 400a, 400, 400c are also provided to a single output connection 504 of the integrated amplifier 500 over a plurality of channels. Three amplifiers 400a, 400b, 400c are shown in the embodiment of FIG. 6. However, it is apparent that the integrated amplifier 500 may comprise any number of amplifier modules, each comprising one of more Doherty amplifier cells 300.

In the embodiment shown in FIG. 6 the control circuit 328 for each amplifier cell may be provided by separate components provided off the amplifier 500. A control signal can be applied to a control input 501 of the integrated amplifier 500 and distributed among the individual cells, and a bias signal may be applied to a bias input 503 and distributed among the individual cells.

Figure 7:
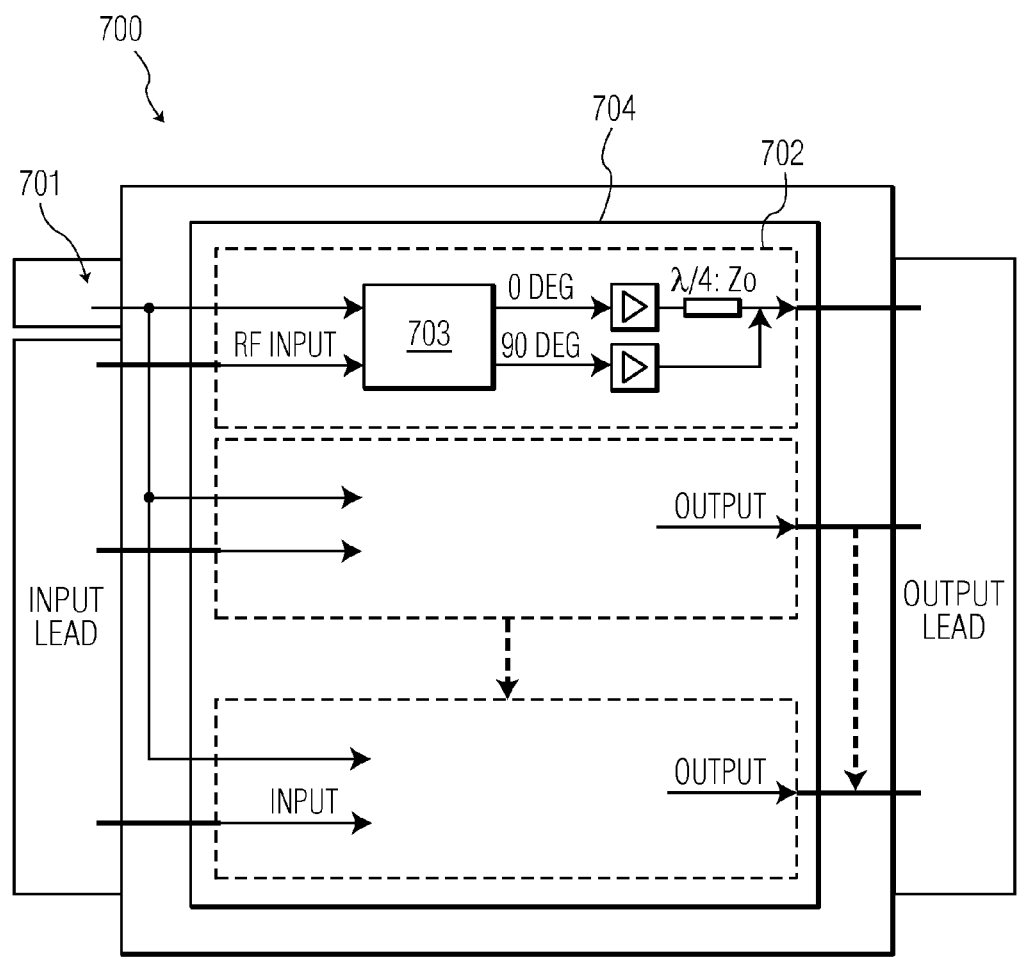
FIG. 7 is a schematic diagram of an alternative exemplary amplifier comprising multiple parallel Doherty amplifier cells.

FIG. 7 illustrates in schematic form a further alternative embodiment of an amplifier 700, comprising a common amplitude and phase control pin 701 connected to each Doherty amplifier cell 702 for control of the controllable splitter 703 of each cell 702. The cells 702 are arranged on a common die 704. This arrangement saves on the die area used for the Doherty amplifier cells, as a control circuit is not required on each individual cell 702. It is preferable that the control circuit is provided in the same package as the amplifier 700, as this allows for faster control of the individual Doherty amplifier cells.

The control pin 701 delivers control signals to the controllable splitter 703 in each cell 702. The control pin 701 may also provide a controlled gate bias to the peak device in each cell 702.

In other embodiments, each Doherty amplifier cell may comprise multiple main and peak amplifiers and signal combining circuits, with a common controllable splitter providing signals to each pair of main and peak amplifiers. In such embodiments, the output of each Doherty amplifier cell is a combination of the combined signals from each of the signal combining circuits. These arrangements save on the space required for a controllable splitter, one of which can be used to provide signals to multiple Doherty amplifier units in a single cell.

Other embodiments are intentionally within the scope of the invention as defined by the appended claims.

The invention claimed is:

1. An amplifier comprising a plurality of Doherty amplifier cells, each Doherty amplifier cell comprising:
   an input and an output respectively connected to an input and an output of the amplifier;
   a main amplifier stage;
   a peak amplifier stage;
   a signal combining circuit configured to combine signals from outputs of the main and peak amplifiers and provide a combined signal to the output of the Doherty amplifier cell;
   a control circuit configured to determine an amplitude of a signal at the input or output of the amplifier and provide a splitter control signal to each controllable splitter in response to the signal amplitude; and
   a controllable input power splitter having an input connected to the input of the Doherty amplifier cell,
   wherein the controllable input power splitter is configured to modify an amplitude and phase of a signal at the input of the Doherty amplifier cell in response to a received splitter control signal and provide a first modified signal to the input of the main amplifier stage and a second modified signal to the input of the peak amplifier stage.

2. The amplifier according to claim 1 wherein the controllable input power splitter comprises:
   a main channel controller with an input coupled to the input of the Doherty amplifier cell and an output coupled to the input of the main amplifier stage; and
   a peak channel controller with an input coupled to the input of the Doherty amplifier cell and an output coupled to the input of the peak amplifier,
   wherein the main channel controller is configured to receive a first splitter control signal, modify the amplitude and phase of the signal at the input of the Doherty amplifier cell in response to the first splitter control signal and provide a first modified signal to the input of the main amplifier stage; and
   wherein the peak channel controller is configured to receive a second splitter control signal, modify the amplitude and phase of a signal at the input of the Doherty amplifier cell in response to the second splitter control signal and provide a second modified signal to the input of the peak amplifier stage.

3. The amplifier according to claim 1 wherein the controllable input power splitter comprises a 90 degree fixed phase shifting element coupled between the input of the Doherty amplifier cell and the input of the peak amplifier stage.

4. The amplifier of claim 1 wherein each Doherty amplifier cell comprises a plurality of main and peak amplifiers and signal combining circuits, wherein the controllable input power splitter for each Doherty amplifier cell is configured to provide the first modified signal to the input of each main amplifier and the second modified signal to the input of each peak amplifier, the output of the Doherty amplifier cell being a combination of the combined signals from each of the signal combining circuits.

5. The amplifier of claim 1 wherein each Doherty amplifier cell comprises a control circuit configured to determine an amplitude of a signal at the input or output of the Doherty amplifier cell and provide a splitter control signal to the controllable splitter in response to the signal amplitude.

6. The amplifier according to claim 5 wherein each Doherty amplifier cell further comprises a supply modulator configured to receive a supply control signal and to set a power supply voltage or current of the main amplifier stage in response to the supply control signal; and
   wherein the control circuit is configured to provide the supply control signal to the supply modulator in response to the signal amplitude.

7. The amplifier according to claim 5 wherein the control circuit is configured to provide a bias control signal to the main and peak amplifiers in response to the signal amplitude.

8. The amplifier according to claim 5 wherein the control circuit comprises a memory and a controller, wherein the controller is configured to obtain a value from the memory corresponding to the signal amplitude and generate a control signal in accordance with the obtained value.

9. The amplifier according to claim 8 wherein the control circuit is configured to determine a temperature of the amplifier, obtain the value from the memory corresponding with the determined temperature and generate a bias control signal in accordance with the obtained value.

* * * * *